(12) United States Patent
Akutsu

(10) Patent No.: US 10,154,587 B2
(45) Date of Patent: Dec. 11, 2018

(54) ELECTRICAL CONNECTION MATERIAL

(71) Applicant: DEXERIALS CORPORATION, Tokyo (JP)

(72) Inventor: Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 277 days.

(21) Appl. No.: 15/027,422

(22) PCT Filed: Sep. 17, 2014

(86) PCT No.: PCT/JP2014/074510
§ 371 (c)(1),
(2) Date: Apr. 5, 2016

(87) PCT Pub. No.: WO2015/056512
PCT Pub. Date: Apr. 23, 2015

(65) Prior Publication Data
US 2016/0255724 A1 Sep. 1, 2016

(30) Foreign Application Priority Data
Oct. 15, 2013 (JP) ................ 2013-215095

(51) Int. Cl.
| | |
|---|---|
| C08F 2/44 | (2006.01) |
| H05K 1/18 | (2006.01) |
| C09J 163/00 | (2006.01) |
| C09J 201/00 | (2006.01) |
| H01R 4/04 | (2006.01) |
| C08F 2/48 | (2006.01) |
| H01L 23/00 | (2006.01) |
| H01B 1/22 | (2006.01) |
| H01B 3/40 | (2006.01) |
| H05K 1/03 | (2006.01) |
| H05K 1/09 | (2006.01) |
| H05K 3/06 | (2006.01) |
| H01R 12/57 | (2011.01) |
| H05K 3/32 | (2006.01) |
| C08F 222/10 | (2006.01) |

(52) U.S. Cl.
CPC ............ *H05K 1/18* (2013.01); *C08F 2/44* (2013.01); *C08F 2/48* (2013.01); *C09J 163/00* (2013.01); *C09J 201/00* (2013.01); *H01B 1/22* (2013.01); *H01B 3/40* (2013.01); *H01L 24/27* (2013.01); *H01L 24/29* (2013.01); *H01L 24/81* (2013.01); *H01L 24/83* (2013.01); *H01R 4/04* (2013.01); *H05K 1/0353* (2013.01); *H05K 1/09* (2013.01); *H05K 3/06* (2013.01); *C08F 222/1006* (2013.01); *H01L 24/13* (2013.01); *H01L 2224/13144* (2013.01); *H01L 2224/27003* (2013.01); *H01L 2224/2712* (2013.01); *H01L 2224/2732* (2013.01); *H01L 2224/2919* (2013.01); *H01L 2224/2929* (2013.01); *H01L 2224/2939* (2013.01); *H01L 2224/29083* (2013.01); *H01L 2224/29294* (2013.01); *H01L 2224/29355* (2013.01); *H01L 2224/29455* (2013.01); *H01L 2224/73204* (2013.01); *H01L 2224/81191* (2013.01); *H01L 2224/81903* (2013.01); *H01L 2224/83101* (2013.01); *H01L 2224/83203* (2013.01); *H01L 2224/83851* (2013.01); *H01L 2224/83856* (2013.01); *H01R 12/57* (2013.01); *H05K 3/323* (2013.01)

(58) Field of Classification Search
USPC ........................................ 428/323
See application file for complete search history.

(56) References Cited

U.S. PATENT DOCUMENTS

2005/0148676 A1  7/2005  Doi et al.
2010/0178501 A1  7/2010  Masuko et al.

FOREIGN PATENT DOCUMENTS

| JP | H08-148210 A | 6/1996 |
|---|---|---|
| JP | H08-148212 A | 6/1996 |

(Continued)

OTHER PUBLICATIONS

Nov. 24, 2017 Office Action issued in Chinese Patent Application No. 201480054982.0.

(Continued)

Primary Examiner — Terressa Boykin
(74) Attorney, Agent, or Firm — Oliff PLC

(57) ABSTRACT

An electrical connection material such as anisotropic conductive film that suppresses generation of warpage at electrical connection portion such as anisotropic conductive connection portion, and does not allow conduction reliability of connection body obtained by electrical connection such as anisotropic conductive connection to be reduced has a structure in which a conductive particle-containing layer is disposed between first insulating thermosetting resin composition layer and second insulating thermosetting resin composition layer. The conductive particle-containing layer is obtained by irradiating conductive particle-containing resin composition layer that contains radically polymerizable acrylate compound, photoradical polymerization initiator, non-radically polymerizable epoxy-based compound, and conductive particles with light, resulting in photoradical polymerization to form B stage state of conductive particle-containing resin composition layer. The first insulating thermosetting resin composition layer and second insulating thermosetting resin composition layer each contain non-radically polymerizable epoxy-based compound and thermal cationic polymerization initiator or thermal anionic polymerization initiator.

8 Claims, 1 Drawing Sheet

(56) References Cited

FOREIGN PATENT DOCUMENTS

| | | |
|---|---|---|
| JP | H08-148213 A | 6/1996 |
| JP | H11-273771 A | 10/1999 |
| JP | 2003-342338 A | 12/2003 |
| JP | 2006-127776 A | 5/2006 |
| JP | 2009-242771 A | 10/2009 |
| JP | 2011-070931 A | 4/2011 |
| JP | 2013-057017 A | 3/2013 |
| JP | 2013-058413 A | 3/2013 |
| JP | 2013-140756 A | 7/2013 |
| JP | 2013-143291 A | 7/2013 |
| WO | 2007/083810 A1 | 7/2007 |
| WO | 2011/089939 A1 | 7/2011 |
| WO | 2012/137838 A1 | 10/2012 |

OTHER PUBLICATIONS

May 22, 2017 Office Action issued in Korean Patent Application No. 10-2016-7008851.
Apr. 5, 2017 Office Action issued in Chinese Patent Application No. 201480054982.0.
Dec. 27, 2016 Office Action issued in Japanese Patent Application No. 2013-215095.
Oct. 4, 2016 Office Action issued in Japanese Patent Application No. 2013-215095.
Oct. 28, 2015 Search Report issued in International Patent Application No. PCT/JP2014/074510.
Oct. 28, 2015 Written Opinion issued in International Patent Application No. PCT/JP2014/074510.
Feb. 17, 2017 Office Action issued in Taiwanese Patent Application No. 103135171.
Jun. 4, 2018 Office Action issued in Chinese Application No. 201480054982.0.

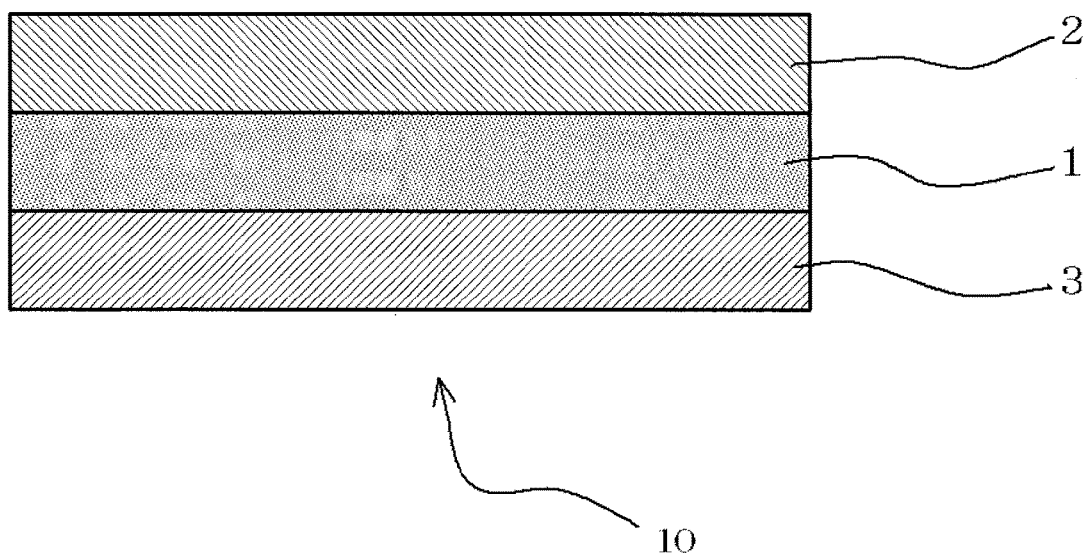

ELECTRICAL CONNECTION MATERIAL

TECHNICAL FIELD

The present invention relates to an electrical connection material such as an anisotropic conductive film, a method of producing the same, and a connection body.

BACKGROUND ART

An anisotropic conductive film constituted by conductive particles and a binder resin composition as a dispersion medium for the particles has been widely used as an electrical connection material during mounting an electronic component such as an IC chip on a substrate. The anisotropic conductive film requires high adhesion strength. Therefore, an epoxy-based adhesive composition capable of achieving higher adhesion strength than that of an acrylate-based adhesive composition has been widely used as the binder resin composition. Such an epoxy-based adhesive composition is generally a composition in which an anionic curing agent or a cationic curing agent is mixed with an epoxy compound.

In an anisotropic conductive film using the epoxy-based adhesive composition as the binder resin composition, a cured product of the epoxy-based adhesive composition cannot sufficiently relax a stress generated at an anisotropic conductive connection portion by curing shrinkage of the epoxy-based adhesive composition. Therefore, such a cured product of the epoxy-based adhesive composition has a problem in which the anisotropic conductive connection portion may be warped. As a countermeasure, there has been a proposal in which a radically polymerizable acrylate composition giving a cured product having relatively more excellent stress relaxation performance than that of an epoxy-based adhesive composition containing a cationic curing agent is mixed in the epoxy-based adhesive composition to impart the stress relaxation performance without decreasing high adhesion strength of the epoxy-based adhesive composition (Patent Literature 1).

CITATION LIST

Patent Literature

Patent Literature 1: Japanese Patent Application Laid-Open No. 2006-127776

SUMMARY OF INVENTION

Technical Problem

In an anisotropic conductive film of Patent Literature 1, the generation of warpage at an anisotropic conductive connection portion can be suppressed to a certain degree, but there are problems in which conduction resistance increases and conduction reliability is reduced during storage of a connection body formed from the anisotropic conductive film at high temperature and high humidity.

An object of the present invention is to solve the problems in the conventional techniques, and also to provide an electrical connection material such as an anisotropic conductive film that suppresses the generation of warpage at an electrical connection portion such as an anisotropic conductive connection portion, and does not allow the conduction reliability of a connection body obtained by electrical connection such as anisotropic conductive connection to be reduced.

Solution to Problem

The present inventor has found that the object can be achieved by use of an electrical connection material such as an anisotropic conductive film that has a structure in which a conductive particle-containing layer is disposed between insulating thermosetting resin composition layers and in which the conductive particle-containing layer is obtained by photo-curing a resin composition layer in which a non-radically polymerizable epoxy-based compound is mixed in a radically polymerizable acrylate-based composition containing conductive particles without use of a curing agent for an epoxy compound to form a B stage state of the resin composition layer. The present invention has thus been completed.

Specifically, the present invention provides an electrical connection material, and preferably an anisotropic conductive film including a conductive particle-containing layer disposed between a first insulating thermosetting resin composition layer and a second insulating thermosetting resin composition layer, wherein the conductive particle-containing layer is obtained by irradiating a conductive particle-containing resin composition layer containing a radically polymerizable acrylate compound, a photoradical polymerization initiator, a non-radically polymerizable epoxy-based compound, and conductive particles with light, resulting in photoradical polymerization to form a B stage state of the conductive particle-containing resin composition layer, and the first insulating thermosetting resin composition layer and the second insulating thermosetting resin composition layer each contain a non-radically polymerizable epoxy-based compound and a thermal cationic polymerization initiator or a thermal anionic polymerization initiator.

The present invention provides a method of producing the electrical connection material of the present invention, and preferably the anisotropic conductive film, the method including the steps of:

forming a film from a conductive particle-containing resin composition containing a radically polymerizable acrylate compound, a photoradical polymerization initiator, a non-radically polymerizable epoxy-based compound, and conductive particles, and irradiating the formed film with light, resulting in photoradical polymerization to form a B stage state of the formed film, to thereby form a conductive particle-containing layer; and layering a first insulating thermosetting resin composition layer containing a non-radically polymerizable epoxy-based compound and a thermal cationic polymerization initiator or a thermal anionic polymerization initiator on one face of the conductive particle-containing layer, and layering a second insulating thermosetting resin composition layer containing a non-radically polymerizable epoxy-based compound and a thermal cationic polymerization initiator or a thermal anionic polymerization initiator on another face of the conductive particle-containing layer.

The present invention further provides a connection body in which a terminal of a first electronic component and a terminal of a second electronic component are subjected to electrical connection, and preferably anisotropic conductive connection by thermoscompression bonding through the electrical connection material of the present invention, and preferably the anisotropic conductive film.

Advantageous Effects of Invention

The electrical connection material, such as an anisotropic conductive film, of the present invention has a structure in which a conductive particle-containing layer is disposed between the first insulating thermosetting resin composition layer and the second insulating thermosetting resin composition layer. For example, when the degrees of curing shrinkage of the first and second insulating thermosetting resin composition layers are made equal to each other, the generation of warpage of a connection body formed using the electrical connection material such as the anisotropic conductive film can be suppressed.

The conductive particle-containing layer is obtained by irradiating a conductive particle-containing resin composition layer that contains a radically polymerizable acrylate compound, a photoradical polymerization initiator, a non-radically polymerizable epoxy-based compound, and conductive particles with light, resulting in photoradical polymerization to form a B stage state of the conductive particle-containing resin composition layer. Therefore, during electrical connection such as anisotropic conductive connection, the conductive particles are unlikely to flow from a portion between terminals to be connected (connection portion), and the conduction reliability can be improved. In addition, a stress relaxation performance can be exerted in the whole electrical connection material such as the anisotropic conductive film. Thus, the generation of warpage of the connection body formed using the electrical connection material such as the anisotropic conductive film can be suppressed.

This conductive particle-containing layer does not contain a polymerization initiator for initiating the polymerization of the non-radically polymerizable epoxy-based compound. For this reason, the conductive particle-containing layer in a B stage state contains the non-radically polymerizable epoxy-based compound that has not been polymerized yet. Therefore, the use of liquid epoxy compound makes it possible to secure fluidity necessary for pushing the conductive particles during the electrical connection such as the anisotropic conductive connection.

The non-radically polymerizable epoxy-based compound contained in the conductive particle-containing layer can be cationically or anionically polymerized by thermal cationic or anionic polymerization caused in the first and second insulating thermosetting resin composition layers by thermocompression bonding during the electrical connection such as the anisotropic conductive connection. Thus, the conductive particle-containing layer can be sufficiently cured. A decrease in the conduction reliability of the connection body formed using the electrical connection material such as the anisotropic conductive film can be suppressed. Therefore, the electrical connection material of the present invention is useful as the anisotropic conductive film, and is also useful as an anisotropic conductive paste, or a general conductive film or conductive paste.

BRIEF DESCRIPTION OF DRAWINGS

FIG. 1 is a cross-sectional view of an anisotropic conductive film as a preferable embodiment of an electrical connection material of the present invention.

DESCRIPTION OF EMBODIMENTS

Hereinafter, the present invention will be described with reference to an anisotropic conductive film as a preferable embodiment of an electrical connection material of the present invention.

<Anisotropic Conductive Film>

As shown in FIG. 1, an anisotropic conductive film 10 of the present invention has a structure in which a conductive particle-containing layer 1 is disposed between a first insulating thermosetting resin composition layer 2 and a second insulating thermosetting resin composition layer 3.

(Conductive Particle-Containing Layer 1)

The conductive particle-containing layer 1 is obtained by irradiating a conductive particle-containing resin composition layer that contains a radically polymerizable acrylate compound, a photoradical polymerization initiator, a non-radically polymerizable epoxy-based compound, and conductive particles with light, resulting in photoradical polymerization to form a B stage state of the conductive particle-containing resin composition layer. Herein, "B stage state" means a state where a curable resin composition is semi-cured and is fluidized or softened by heating.

A conductive particle-containing resin composition layer that is a precursor of the conductive particle-containing layer 1 before photoradical polymerization contains the radically polymerizable acrylate compound, the photo-radical polymerization initiator, the non-radically polymerizable epoxy-based compound, and the conductive particles, but does not contain a polymerization initiator for initiating the polymerization of the non-radically polymerizable epoxy-based compound. This is because the non-radically polymerizable epoxy-based compound is polymerized by polymerization of the first insulating thermosetting resin composition layer 2 and the second insulating thermosetting resin composition layer 3 that are layered on respective faces of the conductive particle-containing layer 1.

In the conductive particle-containing layer 1, the reaction ratio of the radically polymerizable acrylate compound in photoradical polymerization caused by irradiation with light is preferably 70% or more. When the reaction ratio is 70% or more, an effect of suppressing flow of particles during connection can be sufficiently obtained. The reaction ratio can be measured by a known procedure such as FT-IR. When the reaction ratio is 100% that falls within the range of the present invention, the whole conductive particle-containing layer 1 is in a B stage state, not a completely curing state. This is because the conductive particle-containing layer 1 contains the non-radically polymerizable epoxy-based compound that has not been polymerized yet.

Light irradiation conditions (light source, wavelength of light, light intensity, light amount, temperature, etc.) can be appropriately set.

Examples of the radically polymerizable acrylate compound may include monofunctional or polyfunctional (meth)acrylate compounds (herein, (meth)acrylate is a term including acrylate and methacrylate). Examples of the monofunctional (meth)acrylate compound may include methyl (meth)acrylate, ethyl (meth)acrylate, n- and isopropyl (meth)acrylate, n-, iso, sec-, or tert-butyl (meth)acrylate, 2-ethylhexyl (meth)acrylate, benzyl (meth)acrylate, and dicyclopentanyl acrylate. Examples of the polyfunctional (meth)acrylate compound may include difunctional (meth)acrylate compounds such as ethylene glycol di(meth)acrylate, diethylene glycol di(meth)acrylate, 1,6-hexanediol di(meth)acrylate, propylene glycol di(meth)acrylate, dipropylene glycol di(meth)acrylate, 1,2-cyclohexanediol di(meth)acrylate, neopentyl glycol di(meth)acrylate, and dicyclopentadiene di(meth)acrylate, and trifunctional (meth) acrylate compounds such as glycerol tri(meth)acrylate, trimethylolpropane tri(meth)acrylate, pentaerythritol tri (meth)acrylate, and tris(2-acryloyloxyethyl)isocyanurate. Further, those that are epoxy-modified, urethane-modified, ethylene oxide-modified, or propylene oxide-modified can be used. Among them, bisphenol A type epoxy acrylate is preferably used in terms of connection stability after curing.

The photoradical polymerization initiator can be appropriately selected from known photoradical polymerization initiators for use. Examples thereof may include an acetophenone-based photopolymerization initiator, a benzylketal-based photopolymerization initiator, an α-alkylaminophenone-based photopolymerization initiator, and a phosphorus-based photopolymerization initiator. Specific examples of the acetophenone-based photopolymerization initiator may include 2-hydroxy-2-cyclohexylacetophenone (IRGACURE 184, available from BASF Japan Ltd.), α-hydroxy-α,α'-dimethylacetophenone (DAROCUR 1173, available from BASF Japan Ltd.), 2,2-dimethoxy-2-phenylacetophenone (IRGACURE 651, available from BASF Japan Ltd.), 4-(2-hydroxyethoxy)phenyl (2-hydroxy-2-propyl) ketone (IRGACURE 2959, available from BASF Japan Ltd.), and 2-hydroxy-1-{4-[2-hydroxy-2-methyl-propionyl]-benzyl}phenyl}-2-methyl-1-propan-1-one (IRGACURE 127, available from BASF Japan Ltd.). Examples of the benzylketal-based photopolymerization initiator may include benzophenone, fluorenone, dibenzosuberone, 4-aminobenzophenone, 4,4'-diaminobenzophenone, 4-hydroxybenzophenone, 4-chlorobenzophenone, and 4,4'-dichlorobenzophenone. As the α-alkylaminophenone-based photopolymerization initiator, 2-benzyl-2-dimethylamino-1-(4-morpholinophenyl)-butanone-1 (IRGACURE 369, available from BASF Japan Ltd.) can be used. Examples of the phosphorus-based photopolymerization initiator may include bis(2,4,6-trimethylbenzoyl)-phenyl phosphine oxide (IRGACURE 819, available from BASF Japan Ltd.), and (2,4,6-trimethylbenzoyl)-diphenyl phosphine oxide (DAROCURE TPO, available from BASF Japan Ltd.).

The amount of the photoradical polymerization initiator to be added is preferably 0.1 to 40 parts by mass, and more preferably 0.5 to 30 parts by mass, relative to 100 parts by mass of the radically polymerizable acrylate compound. When the amount falls within this range, photoradical polymerization can be sufficiently promoted, and a decrease in the mechanical strength of the conductive particle-containing layer 1 can be suppressed.

Preferable examples of combinations of the radically polymerizable acrylate compound and the photoradical polymerization initiator may include a combination of the bisphenol A type epoxy acrylate and the α-alkylaminophenone-based photopolymerization initiator.

The non-radically polymerizable epoxy-based compound may be liquid or solid. Examples thereof may include compounds that generally have an epoxy equivalent of about 100 to about 4,000, do not have a radically polymerizable unsaturated bond in their molecules, and have an epoxy group of 2 or more. For example, a bisphenol A type epoxy compound, a phenol novolac type epoxy compound, a cresol novolac type epoxy compound, an ester type epoxy compound, or an alicyclic epoxy compound can be preferably used. The compounds include a monomer and an oligomer.

The amount of the non-radically polymerizable epoxy-based compound to be added is preferably 3 to 250 parts by mass, and more preferably 10 to 150 parts by mass, relative to 100 parts by mass of the radically polymerizable acrylate compound. When the amount falls within this range, the adhesion force can be enhanced, and a change of excess warpage can be suppressed.

In addition to the radically polymerizable acrylate compound and the non-radically polymerizable epoxy-based compound, the conductive particle-containing layer 1 may contain a phenoxy resin, an epoxy resin, an unsaturated polyester resin, a saturated polyester resin, a urethane resin, a butadiene resin, a polyimide resin, a polyamide resin, or a polyolefin resin as a resin for forming a film. The amount of the resin component for forming a film to be added is preferably 10 to 200 parts by mass, and more preferably 20 to 150 parts by mass, relative to a total amount of the radically polymerizable acrylate compound and the non-radically polymerizable epoxy-based compound as 100 parts by mass. When the amount falls within this range, the handleability before curing can be improved, and a residual stress after curing that causes warpage can be suppressed.

As the conductive particles, conductive particles constituting a known anisotropic conductive film can be used. Examples thereof may include particles of metal such as nickel, and metal-coating resin particles having a metal plated layer on a surface of a resin core. An insulating thin film may be formed, if necessary.

The average particle diameter of such conductive particles is preferably 1 to 20 μm, and more preferably 2 to 10 μm in terms of conduction retentivity.

The amount of the conductive particles to be added is preferably 2 to 200 parts by mass, and more preferably 5 to 150 parts by mass, relative to a total amount of the radically polymerizable acrylate compound, the non-radically polymerizable epoxy-based compound, and if necessary, the added resin for forming a film as 100 parts by mass. When the amount falls within this range, the conduction reliability can be improved, and an excess decrease in adhesion properties and occurrence of short circuit after connection can be suppressed.

The density of the conductive particles in the conductive particle-containing layer 1 is preferably 1,000 to 150,000 particles/mm$^2$, and more preferably 2,000 to 100,000 particles/mm$^2$ in terms of securement of conduction paths and prevention of short circuit.

The form of the conductive particles present in the conductive particle-containing layer 1 may be a form in which the conductive particles are uniformly mixed in the conductive particle-containing resin composition and a film is formed therefrom, or a form in which the conductive particles are regularly arranged into a single layer by a known procedure such as the use of a transfer mold.

The thickness of the conductive particle-containing layer 1 is preferably 1 to 20 μm, more preferably 2 to 10 μm, and further preferably 3 to 8 μm. When the thickness falls within this range, the particle capture efficiency cannot be decreased more than necessary, and an excess increase in the conduction resistance can be suppressed.

(First Insulating Thermosetting Resin Composition Layer 2 and Second Insulating Thermosetting Resin Composition Layer 3)

These resin composition layers each independently contain a non-radically polymerizable epoxy-based compound and a thermal cationic polymerization initiator or a thermal anionic polymerization initiator.

The non-radically polymerizable epoxy-based compound may be liquid or solid. Examples thereof may include compounds that generally have an epoxy equivalent of about 100 to about 4,000, do not have a radically polymerizable unsaturated bond in their molecules, and have an epoxy group of 2 or more. For example, a bisphenol A type epoxy compound, a phenol novolac type epoxy compound, a cresol novolac type epoxy compound, an ester type epoxy compound, or an alicyclic epoxy compound can be preferably used. The compounds include a monomer and an oligomer. In particular, it is preferable that the non-radically polymerizable epoxy-based compound be the bisphenol A type epoxy compound in terms of connection stability after curing.

As the thermal cationic polymerization initiator, a known thermal cationic polymerization initiator that initiates cationic polymerization of an epoxy compound can be used. For example, a known iodonium salt, sulfonium salt, phosphonium salt, or ferrocene salt can be used. An aromatic sulfonium salt that exhibits favorable latency relative to temperature can be preferably used. Preferable examples of the thermal cationic polymerization initiator may include diphenyliodonium hexafluoroantimonate, diphenyliodonium hexafluorophosphate, diphenyliodonium hexafluoroborate, triphenylsulfonium hexafluoroantimonate, triphenylsulfonium hexafluorophosphate, and triphenylsulfonium hexafluoroborate. Specific examples thereof may include SP-150, SP-170, CP-66, and CP-77 available from Adeka Corporation; CI-2855 and CI-2639 available from Nippon Soda Co., Ltd.; SAN-AID SI-60 and SI-80 available from Sanshin Chemical Industry Co., Ltd.; and CYRACURE-UVI-6990 and UVI-6974 available from Union Carbide Corporation.

When the amount of the thermal cationic polymerization initiator to be added is too small, thermal cationic polymerization is unlikely to proceed sufficiently. When it is too large, the rigidity may be decreased. Therefore, the amount is preferably 0.1 to 40 parts by mass, and more preferably 0.5 to 30 parts by mass, relative to 100 parts by mass of the non-radically polymerizable epoxy-based compound.

As the thermal anionic polymerization initiator, a known thermal anionic polymerization initiator that initiates anionic polymerization of an epoxy compound can be used. Examples thereof may include an aliphatic amine compound, an aromatic amine compound, secondary and tertiary amine compounds, an imidazole compound, a polymercaptan compound, a boron trifluoride-amine complex, dicyandiamide, and an organic acid hydrazide. An encapsulated imidazole compound that exhibits favorable latency relative to temperature can be preferably used. Specific examples thereof may include NOVACURE HX3941HP available from Asahi Kasei E-materials Corporation.

When the amount of the thermal anionic polymerization initiator to be added is too small, thermal anionic polymerization is unlikely to proceed sufficiently. When it is too large, the rigidity may be decreased. Therefore, the amount is preferably 0.1 to 200 parts by mass, and more preferably 0.5 to 150 parts by mass, relative to 100 parts by mass of the non-radically polymerizable epoxy-based compound.

In order to suppress the generation of warpage of the connection body formed using the anisotropic conductive film of the present invention, the difference of degrees of curing shrinkage of the first insulating thermosetting resin composition layer 2 and the second insulating thermosetting resin composition layer 3 is preferably 10% or less. The degree of curing shrinkage can be measured in accordance with JIS K6901. The degree of curing shrinkage of each layer is preferably within 10%, more preferably within 5%, and further preferably within 3%.

The thickness of each of the first insulating thermosetting resin composition layer 2 and the second insulating thermosetting resin composition layer 3 is preferably 0.1 to 30 μm, and more preferably 1 to 20 μm. When the thickness falls within this range, the particle capture efficiency cannot be decreased more than necessary, and an excess increase in the conduction resistance can be suppressed.

As described, the electrical connection material of the present invention has been described with reference to an anisotropic conductive film as an example. However, the electrical connection material of the present invention may include an aspect of an anisotropic conductive paste, a conductive paste, or a conductive film, in addition to the anisotropic conductive film.

<Method of Producing Electrical Connection Material (Preferably Anisotropic Conductive Film)>

The electrical connection material, such as an anisotropic conductive film, of the present invention can be produced by a production method including steps 1 and 2 as described below.

(Step 1)

First, a film is formed from the conductive particle-containing resin composition containing the radically polymerizable acrylate compound, the photoradical polymerization initiator, the non-radically polymerizable epoxy-based compound, and the conductive particles, and the obtained film is irradiated with light, resulting in photoradical polymerization to form a B stage state of the obtained film. Thus, the conductive particle-containing layer is formed.

The conductive particle-containing resin composition can be prepared by uniformly mixing the radically polymerizable acrylate compound, the photoradical polymerization initiator, the non-radically polymerizable epoxy-based compound, the conductive particles, and another component that is added if necessary, such as a film-forming component, by a known procedure, for example, by a planetary mixer. The film can be formed by a known means such as a doctor blade method. In this case, the film is formed from the conductive particle-containing resin composition on a release-treated base sheet (for example, release-treated polyester sheet), and if necessary, dried. Thus, a conductive particle-containing resin composition layer in an uncured state can be formed. The conductive particle-containing resin composition layer thus formed is irradiated with light such as ultraviolet light to photoradically polymerize the radically polymerizable acrylate compound so that the reaction ratio of the radically polymerizable acrylate compound is preferably 70% or more, and more preferably 90% or more. Thus, the conductive particle-containing layer in a B stage state is formed.

(Step 2)

The first insulating thermosetting resin composition layer containing the non-radically polymerizable epoxy-based compound and the thermal cationic polymerization initiator or the thermal anionic polymerization initiator is layered on one face of the conductive particle-containing layer, and the second insulating thermosetting resin composition layer containing the non-radically polymerizable epoxy-based compound and the thermal cationic polymerization initiator or the thermal anionic polymerization initiator is layered on another face of the conductive particle-containing layer. Thus, the electrical connection material such as the anisotropic conductive film of the present invention is obtained.

The first insulating thermosetting resin composition layer and the second insulating thermosetting resin composition layer can be formed as follows. First, each insulating thermosetting resin composition is prepared by uniformly mixing the non-radically polymerizable epoxy-based compound, the thermal cationic polymerization initiator or the thermal anionic polymerization initiator, and the other component that is added if necessary, such as the film-forming component, by a known procedure, for example, by a planetary mixer. From the resin composition, a film is formed on a release-treated base sheet by a known means such as a doctor blade method, and dried, if necessary. Thus, the first insulating thermosetting resin composition layer and the second insulating thermosetting resin composition layer both in an uncured state are formed.

Subsequently, the first insulating thermosetting resin composition layer is layered on the conductive particle-containing layer formed in advance, and compression-bonded. The release-treated base sheet on the side of the conductive particle-containing layer is then separated, and the second insulating thermosetting resin composition layer is layered. The obtained layered body is compression-bonded to obtain the electrical connection material such as the anisotropic conductive film of the present invention. Alternatively, the conductive particle-containing layer having been separated from the release-treated base sheet can be disposed between the first and second insulating thermosetting resin composition layers, and the obtained layered body can be compression-bonded to obtain the electrical connection material such as the anisotropic conductive film of the present invention.

<Connection Body>

The electrical connection material such as the anisotropic conductive film of the present invention is disposed between a terminal (for example, bump) of a first electronic component (for example, IC chip) and a terminal (for example, bump and pad) of a second electronic example, wiring substrate), and they are subjected to electrical connection, and preferably anisotropic conductive connection by thermocompression bonding from the first or second electronic component side. Thus, the connection body can be obtained.

EXAMPLES

Hereinafter, the present invention will be described specifically by way of Examples.

Examples 1 to 7 and Comparative Examples 1 to 4

(Formation of First Insulating Thermosetting Resin Composition Layer)

In accordance with each chemical composition (unit: part by mass) shown in Table 1, a first insulating thermosetting resin composition mixed liquid with a solid content of 50% was prepared using toluene. This mixed liquid was applied to a release PET base sheet so that a dried thickness was 8 and dried at 80° C. for 5 minutes, to form a first insulating thermosetting resin composition layer.

(Formation of Second Insulating Thermosetting Resin Composition Layer)

In accordance with each chemical composition (unit: part by mass) shown in Table 1, a second insulating thermosetting resin composition mixed liquid with a solid content of 50% was prepared using toluene. This mixed liquid was applied to a release PET base sheet so that a dried thickness was 8 μm, and dried at 80° C. for 5 minutes, to form a second insulating thermosetting resin composition layer.

(Formation of Conductive Particle-Containing Layer)

In accordance with each chemical composition (unit: part by mass) shown in Table 1, a conductive particle-containing resin composition mixed liquid with a solid content of 50% was prepared using toluene. This mixed liquid was applied to a release PET base sheet so that a dried thickness was 6 μm, dried at 80° C. for 5 minutes, and irradiated with ultraviolet light so that the integrated light amount was as shown in Table 1, resulting in photoradical polymerization, to form a conductive particle-containing layer. The reaction ratio of the radically polymerizable acrylate compound in the conductive particle-containing layer was measured by FT-IR (FT/IR-4100 manufactured by JASCO Corporation). The obtained results are shown in Table 1.

(Production of Anisotropic Conductive Film)

The conductive particle-containing layer was layered on the first insulating thermosetting resin composition layer, and lamination was performed. The release PET base sheet on a side of the conductive particle-containing layer was then separated to expose the conductive particle-containing layer. The second insulating thermosetting resin composition layer was layered on the exposed conductive particle-containing layer, and the layered body was subjected to lamination over the release PET base sheet under conditions of 40° C. and 0.1 Pa to obtain an anisotropic conductive film.

<Evaluation of Connection Body>

(Production of Connection Body)

A bump of an IC chip and an ITO pattern electrode of a glass substrate were subjected to anisotropic conductive connection by thermocompression bonding using the anisotropic conductive film produced in each of Examples and Comparative Examples. During the anisotropic conductive connection, the first insulating resin composition layer was disposed on an IC chip side.

Thermocompression bonding conditions: 180° C., 80 MPa, and 5 seconds

Size of IC chip: 1.5 mm×20 mm, 0.5 mmt

Bump of IC chip: gold-plated bump, 30 μm×85 μm, height of bump: 15 μm, pitch of bump: 50 μm Size of glass substrate having ITO pattern electrode of 200 nm in thickness: 50 mm×30 mm, 0.3 mmt (1737F, Corning Incorporated)

(Performance Evaluation)

As described below, "initial conduction resistance," "conduction resistance (conduction reliability) after high temperature and high humidity load test," and "warpage of connection body" of the obtained connection body were measured. The obtained results are shown in Table 1.

"Initial Conduction Resistance"

The initial conduction resistance of the connection body immediately after production was measured by a commercially available resistance measurement device. For practical use, the initial conduction resistance is desirably 10Ω or less.

"Conduction Resistance (Conduction Reliability) After High Temperature and High Humidity Load Test"

The connection body was allowed to stand for 1,000 hours in a chamber where 85° C. and 85% Rh were maintained, and the conduction resistance of the connection body was then measured by a commercially available resistance measurement device. For practical use, the conduction resistance after the test is desirably 15Ω or less.

<Warpage of Connection Body>

Warpage of the connection body on a surface of the glass substrate on a side where the IC chip was not mounted was measured at a width corresponding to the back side of the IC chip of 20 mm by a commercially available three-dimensional shape measurement system (Keyence Corporation). The size of the warpage is desirably within 10 μm.

TABLE 1

| | | | Example | | | | | | |
|---|---|---|---|---|---|---|---|---|---|
| | | | 1 | 2 | 3 | 4 | 5 | 6 | 7 |
| First Insulating Thermosetting Resin Composition Layer | Phenoxy Resin for Forming Film | YP-50, Nippon Steel & Sumikin Chemical Co., Ltd. | 60 | 60 | 60 | 60 | 60 | 60 | 60 |
| | Non-Radically Polymerizable Epoxy Compound | jER828, Mitsubishi Chemical Corporation | 40 | 40 | 40 | 40 | 40 | 40 | 40 |
| | Thermal Cationic Polymerization Initiator | SI-60L, Sanshin Chemical Industry Co., Ltd. | 3 | 3 | 3 | 3 | 3 | 3 | 3 |
| Conductive Particle-Containing Layer | Phenoxy Resin for Forming Film | YP-50, Nippon Steel & Sumkin Chemical Co., Ltd. | 60 | 60 | 60 | 60 | 60 | 60 | 60 |
| | Non-Radically Polymerizable Epoxy Compound | jER828, Mitsubishi Chemical Corporation | 15 | 5 | 40 | 15 | 15 | 15 | 15 |
| | Radically Polymerizable Acrylate Compound | EB600, Daicel-Allnex Ltd. | 40 | 40 | 40 | 10 | 70 | 40 | 40 |
| | Photoradical Polymerization Initiator | IRGACURE 369, BASF Japan Ltd. | 3 | 3 | 3 | 3 | 3 | 3 | 3 |
| | Conductive Particles | AUL 704, Sekisui Chemical Co., Ltd. | 30 | 30 | 30 | 30 | 30 | 30 | 30 |
| | Thermal Radical Polymerization Initiator | Perhexyl Z, NOF Corporation | — | — | — | — | — | — | — |
| | Irradiation with UV | Presence or Absence | Presence | Presence | Presence | Presence | Presence | Presence | Presence |
| | | Integrated Light Amount [mJ/cm$^2$] | 4000 | 4000 | 4000 | 4000 | 4000 | 2000 | 6000 |
| | | Reaction Ratio [%] | 90 | 90 | 90 | 90 | 90 | 70 | 99 |
| Second Insulating Thermosetting Resin Composition Layer | Phenoxy Resin for Forming Film | YP-50, Nippon Steel & Sumikin Chemical Co., Ltd. | 60 | 60 | 60 | 60 | 60 | 60 | 60 |
| | Non-Radically Polymerizable Epoxy Compound | jER828, Mitsubishi Chemical Corporation | 40 | 40 | 40 | 40 | 40 | 40 | 40 |
| | Thermal Cationic Polymerization Initiator | SI-60L, Sanshin Chemical Industry Co., Ltd. | 3 | 3 | 3 | 3 | 3 | 3 | 3 |
| Evaluation Results | Initial Conduction Resistance | [Ω] | 0.2 | 0.2 | 0.2 | 0.2 | 0.2 | 0.2 | 0.2 |
| | Conduction Resistance after High Temperature and High Humidity Load Test (80° C., 85% Rh, 1000 hr) | [Ω] | 10 | 10 | 10 | 15 | 10 | 5 | 0 |
| | Warpage of Connection Body | [μm] | 7 | 7 | 7 | 6 | 9 | 6 | 9 |

| | | | Comparative Example | | | |
|---|---|---|---|---|---|---|
| | | | 1 | 2 | 3 | 4 |
| First Insulating Thermosetting Resin Composition Layer | Phenoxy Resin for Forming Film | YP-50, Nippon Steel & Sumikin Chemical Co., Ltd. | 60 | 60 | 60 | 60 |
| | Non-Radically Polymerizable Epoxy Compound | jER828, Mitsubishi Chemical Corporation | 40 | 40 | 40 | 40 |
| | Thermal Cationic Polymerization Initiator | SI-60L, Sanshin Chemical Industry Co., Ltd. | 3 | 3 | 3 | 3 |
| Conductive Particle-Containing Layer | Phenoxy Resin for Forming Film | YP-50, Nippon Steel & Sumkin Chemical Co., Ltd. | 60 | 60 | 60 | 60 |
| | Non-Radically Polymerizable Epoxy Compound | jER828, Mitsubishi Chemical Corporation | 15 | 15 | — | 15 |
| | Radically Polymerizable Acrylate Compound | EB600, Daicel-Allnex Ltd. | 40 | 40 | 40 | 40 |
| | Photoradical Polymerization Initiator | IRGACURE 369, BASF Japan Ltd. | — | 3 | 3 | — |
| | Conductive Particles | AUL 704, Sekisui Chemical Co., Ltd. | 30 | 30 | 30 | 30 |
| | Thermal Radical Polymerization Initiator | Perhexyl Z, NOF Corporation | — | — | — | 3 |

TABLE 1-continued

| | | | | | | |
|---|---|---|---|---|---|---|
| | Irradiation with UV | Presence or Absence | Absence | Absence | Presence | Absence |
| | Integrated Light Amount | [mJ/cm²] | — | — | 4000 | — |
| | Reaction Ratio | [%] | 90 | 90 | 90 | 90 |
| Second Insulating Thermosetting Resin Composition Layer | Phenoxy Resin for Forming Film | YP-50, Nippon Steel & Sumikin Chemical Co., Ltd. | 60 | 60 | 60 | 60 |
| | Non-Radically Polymerizable Epoxy Compound | jER828, Mitsubishi Chemical Corporation | 40 | 40 | 40 | 40 |
| | Thermal Cationic Polymerization Initiator | SI-60L, Sanshin Chemical Industry Co., Ltd. | 3 | 3 | 3 | 3 |
| Evaluation Results | Initial Conduction Resistance | [Ω] | 0.2 | 0.2 | 0.2 | 0.2 |
| | Conduction Resistance after High Temperature and High Humidity Load Test (80° C., 85% Rh, 1000 hr) | [Ω] | 130 | 130 | 100 | 80 |
| | Warpage of Connection Body | [μm] | 7 | 7 | 7 | 12 |

<Consideration>

The anisotropic conductive films in Examples 1 to 7 had excellent conduction reliability and are slightly warped. As shown from the results of the anisotropic conductive film of Example 4 in which the amount of acrylate to be added is relatively low and accordingly the rigidity is relatively low and the anisotropic conductive film of Example 6 in which the reaction ratio is relatively low and accordingly the rigidity is relatively low, as the rigidity of the anisotropic conductive film is lower, the anisotropic conductive film is unlikely to be warped. On the other hand, in Examples 5 and 7 in which the rigidity is relatively high, the anisotropic conductive films are easily warped.

In Comparative Examples 1, 2, and 4, the conductive particle-containing layer was not irradiated with light. Therefore, there was a problem in terms of conduction reliability. In Comparative Example 3, the conductive particle-containing layer was irradiated with light, but the photoradical polymerization initiator was not contained. Therefore, there was also a problem in terms of conduction reliability. Further, the thermal radical polymerization initiator was contained. Therefore, the film was largely warped by curing immediately after anisotropic conductive connection.

INDUSTRIAL APPLICABILITY

According to an electrical connection material such as an anisotropic conductive film of the present invention, the generation of warpage at an electrical connection portion such as an anisotropic conductive connection portion is suppressed, and the conduction reliability of a connection body obtained by electrical connection such as anisotropic conductive connection is not reduced. Therefore, the anisotropic conductive film of the present invention is useful when an electronic component such as an IC chip is flip-chip mounted on another electronic component such as a wiring substrate.

REFERENCE SIGNS LIST 1 conductive particle-containing layer
2 first insulating thermosetting resin composition layer
3 second insulating thermosetting resin composition layer

The invention claimed is:

1. An electrical connection material comprising a conductive particle-containing layer disposed between a first insulating thermosetting resin composition layer and a second insulating thermosetting resin composition layer that is a member separate from the first insulating thermosetting resin composition layer, wherein
   the conductive particle-containing layer is formed by a step of irradiating a conductive particle-containing resin composition layer containing a radically polymerizable acrylate compound, a photoradical polymerization initiator, a non-radically polymerizable epoxy-based compound, and conductive particles with light, resulting in photoradical polymerization to form a B stage state of the conductive particle-containing resin composition layer, and the conductive particle-containing resin composition layer contains no polymerization initiator for polymerizing a non-radically polymerizable epoxy-based compound, and
   the first insulating thermosetting resin composition layer and the second insulating thermosetting resin composition layer each contain a non-radically polymerizable epoxy-based compound and a thermal cationic polymerization initiator or a thermal anionic polymerization initiator.

2. The electrical connection material according to claim 1, wherein a reaction ratio of the radically polymerizable acrylate compound in the conductive particle-containing layer is 70% or more.

3. The electrical connection material according to claim 1, wherein the radically polymerizable acrylate compound is a bisphenol A epoxy acrylate and the photoradical polymerization initiator is an α-alkylaminophenone-based photopolymerization initiator.

4. The electrical connection material according to claim 1, wherein the non-radically polymerizable epoxy-based compound is a bisphenol A epoxy compound, and the thermal cationic polymerization initiator is an aromatic sulfonium salt.

5. The electrical connection material according to claim 1, wherein a difference of degrees of curing shrinkage of the first insulating thermosetting resin composition layer and the second insulating thermosetting resin composition layer is 10% or less.

6. A production method of the electrical connection material according to claim 1, the method comprising the steps of:

forming a film from a conductive particle-containing resin composition containing a radically polymerizable acrylate compound, a photoradical polymerization initiator, a non-radically polymerizable epoxy-based compound, and conductive particles, and irradiating the formed film with light, resulting in photoradical polymerization to form a B stage state of the formed film, to thereby form a conductive particle-containing layer; and layering a first insulating thermosetting resin composition layer containing a non-radically polymerizable epoxy-based compound and a thermal cationic polymerization initiator or a thermal anionic polymerization initiator on one face of the conductive particle-containing layer, and layering a second insulating thermosetting resin composition layer containing a non-radically polymerizable epoxy-based compound and a thermal cationic polymerization initiator or a thermal anionic polymerization initiator on another face of the conductive particle-containing layer.

7. The production method according to claim 6, wherein the film of the conductive particle-containing resin composition is irradiated with light so that a reaction ratio of the radically polymerizable acrylate compound is 70% or more.

8. A connection body in which a terminal of a first electronic component and a terminal of a second electronic component are subjected to electrical connection through the electrical connection material according to claim 1.

* * * * *